United States Patent [19]

Lee et al.

[11] Patent Number: 5,262,989
[45] Date of Patent: Nov. 16, 1993

[54] CIRCUIT FOR SENSING BACK-BIAS LEVEL IN A SEMICONDUCTOR MEMORY DEVICE

[75] Inventors: Young-Taek Lee, Seoul; Jin-Man Han, Chuncheon; Kyoung-Ho Kim; Hong-Seon Hwang, both of Suwon, all of Rep. of Korea

[73] Assignee: SamSung Electronics Co., Ltd., Suwon, Rep. of Korea

[21] Appl. No.: 760,187

[22] Filed: Sep. 16, 1991

[30] Foreign Application Priority Data

Jun. 17, 1991 [KR] Rep. of Korea .................. 1991-9999

[51] Int. Cl.⁵ .............................................. G11C 13/00
[52] U.S. Cl. ............................ 365/189.01; 365/159; 331/64
[58] Field of Search ............... 365/189.01, 244, 159; 331/64

[56] References Cited

U.S. PATENT DOCUMENTS 5,138,190 8/1992 Yamazaki et al. .................. 365/226

Primary Examiner—Terrell W. Fears
Attorney, Agent, or Firm—Robert E. Bushnell

[57] ABSTRACT

A back-bias level sensor used for a semiconductor device wherein a sensing current for sensing a back-bias voltage is prevented from directly flowing into the substrate (or the back-bias voltage terminal). The gate of a PMOS transistor is provided with the back-bias voltage while the source is provided with a ground voltage, so that a pump circuit performs the pumping operation to increase the back-bias voltage when the back-bias voltage is lower than a predetermined voltage level; otherwise, the pump circuit is de-energized, thereby reducing the back-bias voltage.

28 Claims, 7 Drawing Sheets

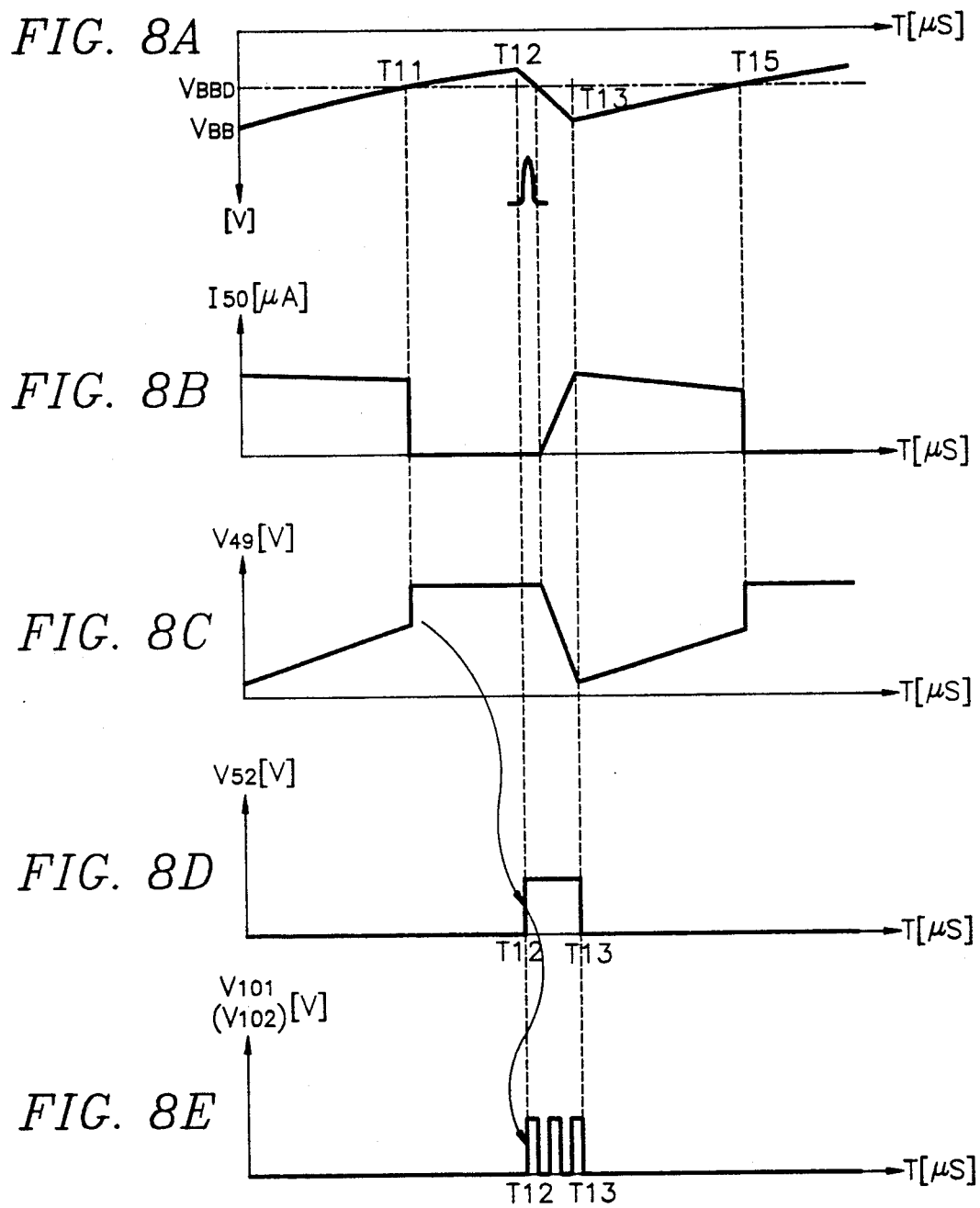

CIRCUIT FOR SENSING BACK-BIAS LEVEL IN A SEMICONDUCTOR MEMORY DEVICE

BACKGROUND OF THE INVENTION

The present invention relates to a semiconductor memory device and particularly to a circuit for sensing a back-bias level generated from a back-bias generator.

Usually, a substrate of a semiconductor memory device is provided with a negative voltage of a predetermined level, so as to allow the threshold voltage of a MOS transistor included in the memory device to be stable, to prevent parasitic capacitance, and to prevent faulty operation of the memory device due to undershoot of an external signal. For example, in a case where a DRAM cell has an NMOS transistor as a memory cell, and an N-type conductive polysilicon capacitor (or a capacitor with an N-type conductive diffusion region), a specific voltage of $-2 \sim -2.5V$ must be applied to the substrate (or to the plate electrode of the capacitor). This voltage is called the back-bias voltage or substrate voltage. Generally, a circuit for generating the back-bias voltage (hereinafter, referred to as the back-bias generator for short) has a pumping circuit for keeping the back-bias voltage at a constant negative voltage of a predetermined level, an oscillator for driving the pumping circuit, and a back-bias level sensor for sensing the current back-bias voltage level and controlling the oscillator in response to the sensing signal.

Referring to FIG. 1, such a back-bias generator is schematically illustrated, wherein an oscillator 100 is generally comprised of an inverter chain, and a pump circuit 300 includes a capacitor for pumping the back-bias voltage VBB in response to a pumping clock provided thereto from the oscillator 100 via a driver 200. Furthermore, the back-bias voltage VBB is fed back to the oscillator 100 through the back-bias level sensor 400. The back-bias level sensor 400 changes the output of the oscillator 100 in response to a sensing signal of the current back-bias voltage VBB. Namely, if the current back-bias level is lower than a desired level, (in this case the back-bias level must be increased) the back-bias level sensor 400 reflects this situation on the oscillator 100; thus the oscillator 100 generates a control signal (or pumping clock) for energizing the pump circuit 300 in response to the output signal from the back-bias level sensor 400. As a result, the pump circuit 300 performs the pumping operation, thereby increasing the low back-bias voltage level VBB up to the desired voltage level. It should be noted that, for convenience, in this specification the back-bias level refers to the absolute value. On the contrary, if the current back-bias voltage VBB is higher than the desired level, (in this case the back-bias level must be decreased) the oscillator 100 generates, in response to the sensing signal from the back-bias level sensor 400, a control signal for preventing the pump circuit 300 from performing the pumping operation.

It is essentially required that the back-bias level sensor senses the back-bias voltage VBB efficiently, without directly influencing the back-bias voltage VBB itself. An example of the conventional back-bias level sensor uses a voltage divider comprised of resistors or resistance elements. Such a device is disclosed in U.S. Pat. No. 4,471,290, issued on Sept. 11, 1984. In the disclosure of the patent, the back-bias level sensor includes a voltage divider comprised of series resistors R1, R2 connected between the back-bias voltage and the ground voltage. A connection node of the series resistors is coupled to the input of a level sensor.

Accordingly, the connection node of the voltage divider always has the back-bias voltage of $$\frac{R2}{R1 + R2} VBB.$$

and then this divided voltage level is compared with a reference level at the level sensor. The level sensor reflects the comparison signal on the oscillator. However, the current flow is always formed between the back-bias voltage terminal and the ground voltage terminal via the series resistors R1 and R2, resulting in degradations of the back-bias voltage due to not only the hole currents in the semiconductor substrate but also the current flow through the series resistors (i.e., the current flow from the ground voltage terminal to the back-bias voltage terminal).

Another example of a conventional back-bias level sensor is shown in FIG. 2. This circuit utilizes the rectifying characteristics of the diode-connected MOS transistor. As illustrated, a PMOS transistor 21 and an NMOS transistor 23 are always turned on, and the voltage of a connection node 22 is determined by the voltage dividing means comprised of the MOS transistors 21, 23 and 24. The connection node 22, between the series connected MOS transistors 21 and 23 that are coupled to the power supply voltage Vcc, is connected to the oscillator 100 of FIG. 1 via a delay circuit 26. The PMOS transistor 24 is coupled between the NMOS transistor 23 and the back-bias voltage VBB, one end of the channel and the gate of the PMOS transistor 24 being coupled in common to the back-bias voltage VBB and the other end of the channel being coupled to the channel of the NMOS transistor 23. The voltage at the connection node 22 is applied to the oscillator 100 by way of the delay circuit 26 and moreover this voltage can be previously adjusted to a voltage VBBD by means of changing the size of the MOS transistors 21, 23 and 24, where VBBD is the voltage level at which the oscillator 100 is enabled.

With reference to FIGS. 3A to 3F, operation of the conventional back-bias level sensor will be considered hereinafter. In the drawings, the back-bias voltage VBB, the pass current Ix passing from the power supply voltage Vcc to the back-bias voltage terminal VBB, the voltage V22 at the connection node 22, the voltage output V28 of the delay circuit 26, the voltage output $V_{osc}$ of the oscillator 100, and detailed voltage characteristic curves of the back-bias level sensor are respectively illustrated. It is noted that the pass current Ix is proportional to the back-bias voltage VBB. As can be seen in FIG. 3A, up to time tI, the voltage VBB is a lower negative value (i.e., higher absolute value) than the voltage VBBD; therefore, the pass current Ix is also larger than the pass current Ix that at the time tl. This is because the pass current Ix flows into the back-bias voltage terminal VBB and, accordingly, the back-bias voltage level increases undesirably due to the pass current Ix (and the hole current of the substrate). This phenomenon is called the degradation of the back-bias voltage.

In the meantime, the voltages VBB and VBBD become identical to each other at time t1, and thereafter the voltage VBB has a gradually lower absolute value than the voltage VBBD; therefore, the pass current Ix flowing into the back-bias voltage terminal VBB decreases and the voltage level at the connection node 22 increases, thereby changing the voltage output V28 of the delay circuit 26 to the logic high level being applied to the oscillator 100 (see FIGS. 3C and 3D). Then, the oscillator 100 is enabled and consequently generates pumping clocks as shown in FIG. 3E, the pumping clocks being applied to the pump circuit 300, so that the pump circuit 300 performs the pumping operation for the back-bias voltage from time t2. In prosecution of the voltage pumping operation, if the voltage VBB crosses the voltage VBBD at time t3, the voltage V22 at the connection node 22 decreases, thereby finally changing the input voltage of the oscillator 100 to the logic low level at time t4 as shown in FIG. 3E, so that the pumping operation halts at time t4. Since the pass current Ix flows into the back-bias terminal VBB even for the time when the pumping operation halts at time t4, the absolute value of the back-bias voltage will decrease again. In the meanwhile, if the back-bias voltage VBB becomes lower than the voltage VBBD at time t5, the foregoing operations will be repeated.

Furthermore, reference will now be made to FIG. 3F for showing the concrete operational curves of the back-bias level sensor 4 of FIG. 2. In the drawing, the curves V22, V27 and V29 represent the voltages at the connection nodes 22, 27 and 29, respectively. Since the gate of the PMOS transistor 21 of the back-bias level sensor 4 is provided with the ground voltage Vss, the gate-source voltage Vgs is independent of the power supply voltage Vcc. Therefore, the voltage at the output node 22 is greatly influenced according to the variation of the power supply voltage as shown in FIG. 3F. In addition, it takes a relatively long time for the pass current Ix to pass through the two MOS transistors 23 and 24, so that the back-bias level sensor has slow response characteristics.

As described above, the conventional back-bias level sensor of FIG. 2 is designed such that the back-bias voltage terminal VBB is under the direct influence of the pass current Ix for sensing the back-bias voltage, therefore resulting in the degradations of the back-bias voltage which are mainly caused by the pass current (for sensing the back-bias level) as well as the hole current of the substrate. As a result, it is therefore unavoidable to frequently turn on/off the oscillator 100 and the pump circuit 300 in the conventional back-bias generator, so that the reliability thereof (particularly of the back-bias level sensor) is low and the total current consumption of the back-bias generator is high. Furthermore, as shown in FIG. 3A, in the event that the back-bias voltage VBB changes abruptly to a different voltage level due to the pumping operation, a peak current flow is formed at the back-bias voltage terminal VBB. If this peak current is often generated due to the very frequent pumping operation, the device may be subjected to faulty operation or defectiveness and in the worst case, the dielectric breakdown phenomenon of the PMOS transistor 24 may occur at the gate oxide layer thereof. Both of the back-bias level sensors of U.S. Pat. No. 4,471,290 and FIG. 2, may cause the same bad situation as above, in the light of the fact that the back-bias voltage is under the direct influence of the sensing current therefor. In particular, because in the circuitry of FIG. 2, the voltage applied to the gate of the load PMOS transistor 21 is independent of the power supply voltage, this back-bias level sensor is considerably influenced according to the variation of the power supply voltage. It will be further appreciated by a person skilled in the art that any conventional back-bias generator which employs the back-bias level sensor as described above will have the same problems.

SUMMARY OF THE INVENTION

It is accordingly an object of the present invention to provide a circuit for sensing back-bias level with a high degree of reliability, used in a back-bias generator.

It is another object of the present invention to provide a back-bias generator with a low current consumption.

It is still another object of the present invention to provide a circuit for sensing back-bias level which has a fast sensing operation as well as of a high degree of reliability.

According to an aspect of the present invention, a circuit for sensing a back-bias voltage level in a back-bias generator having a pump circuit includes: a control terminal coupled to the back-bias voltage; a sensing terminal coupled to the pump circuit by way of an oscillator and a driver for driving the pump circuit; and an electrical channel for electrically connecting the sensing terminal to a ground reference voltage terminal in response to the level of the back-bias voltage, the channel being electrically insulated from the control terminal by an insulating element.

According to another aspect of the present invention, a circuit for sensing a back-bias voltage level in a back-bias generator having a pump circuit for supplying the back-bias voltage of a given level to the substrate, and an oscillator for providing the pump circuit with the pumping clock, includes a first PMOS transistor with the gate coupled to the voltage Vcc/2 from the cell plate voltage generator, one end of the channel being coupled to the power supply voltage and the other end of the channel being coupled to the input terminal of the oscillator, and a second PMOS transistor with the gate coupled to the back-bias voltage, one end of the channel being coupled to the ground voltage and the other end of the channel being coupled to the channel of the first PMOS transistor.

BRIEF DESCRIPTION OF THE ACCOMPANYING DRAWINGS

For a better understanding of the invention and to show how the same may be carried into effect, reference will now be made, by way of example, to the accompanying diagrammatic drawings, in which:

FIGS. 8A to 8F are operational waveforms of the inventive back-bias level sensor.

DETAILED DESCRIPTION OF THE PREFERRED EMBODIMENTS

Figure 4:
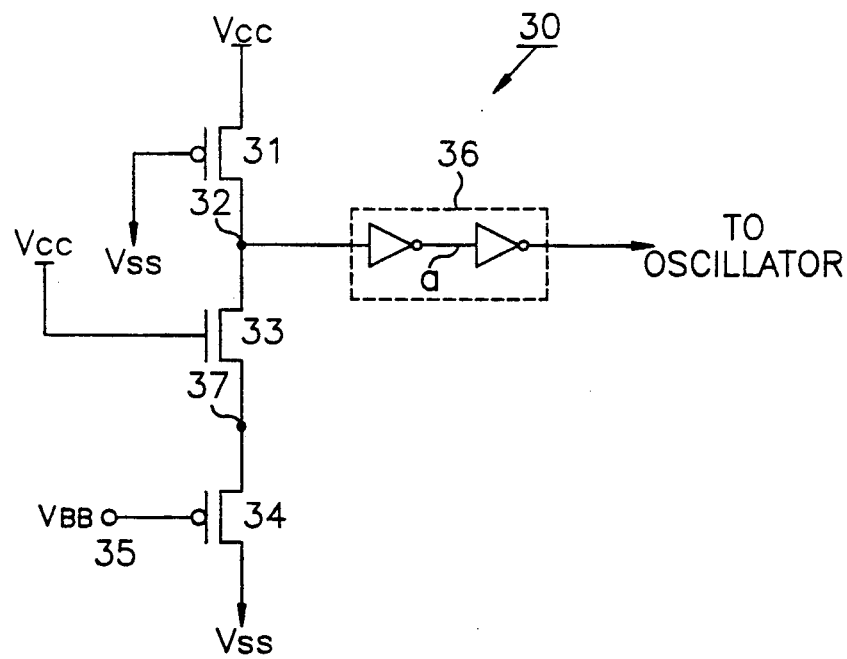
FIG. 4 is an embodiment of a back-bias level sensor according to the present invention.

With reference to FIG. 4, an embodiment of the back-bias level sensor in accordance with the present invention has a PMOS transistor 31, an NMOS transistor 33 and a delay circuit 36 connected in the same manner as the conventional back-bias level sensors. However, a PMOS transistor 34 is connected between the NMOS transistor 33 and the ground voltage level Vss, the gate of the PMOS transistor 34 being coupled to the back-bias voltage VBB. The voltage level at the connection node 32 between the series connected MOS transistors 31 and 33 is dependent on the operation of the PMOS transistor 34.

Figure 2:
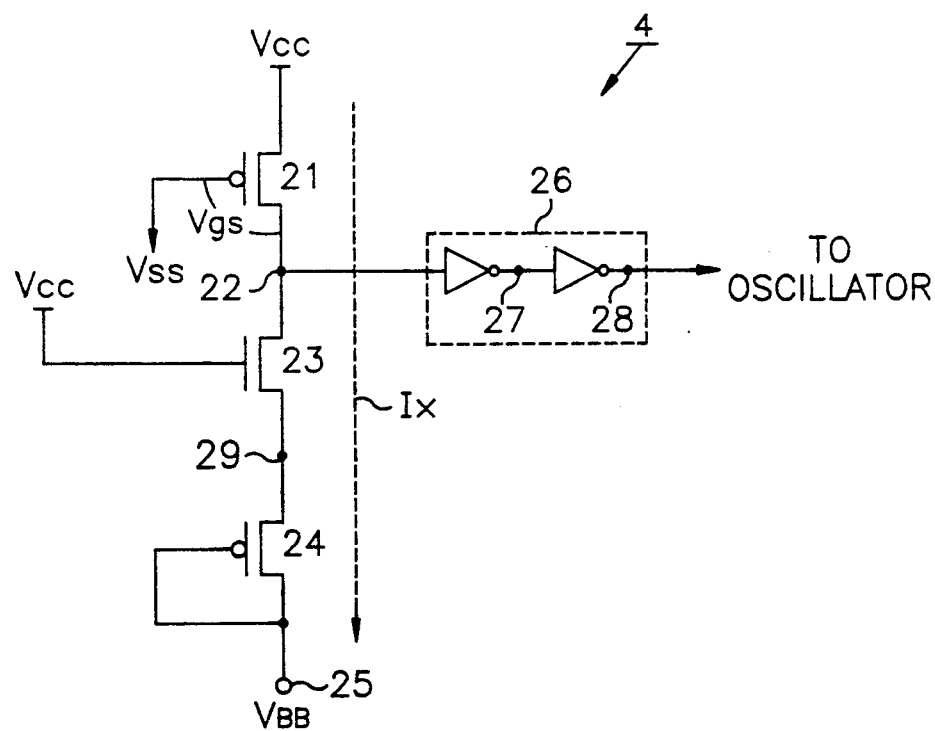
FIG. 2 is a circuit diagram of a conventional back-bias level sensor.
Figure 5:
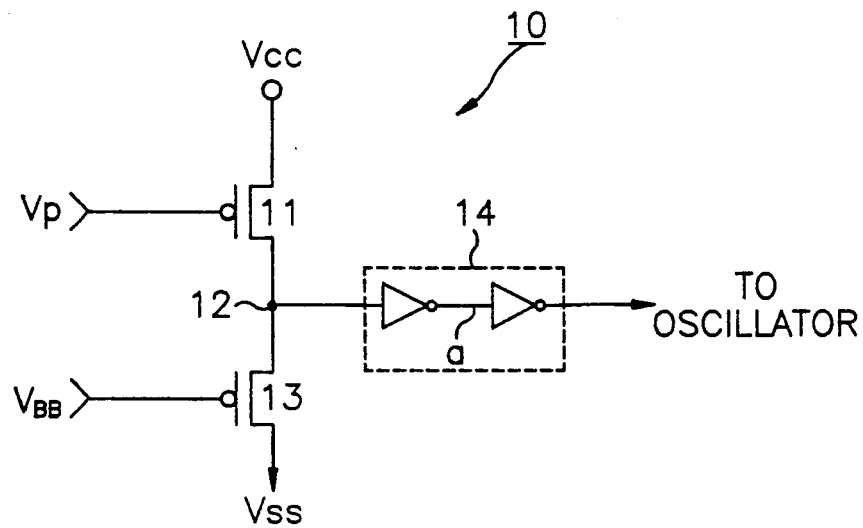
FIG. 5 is another embodiment of the back-bias level sensor according to the present invention.

Reference will now be made to FIG. 5 which illustrates another embodiment of the invention. As illustrated, the load PMOS transistor 11 has the gate provided with the cell plate voltage $V_p$ which is Vcc/2, one end of the channel being coupled to the power supply voltage and the other end of the channel being coupled to the output node 12. Further, the driving PMOS transistor 13 has the gate coupled to the back-bias voltage VBB, one end of the channel being coupled to the ground voltage and the other end of the channel being coupled to the output node 12. Herein, it should be noted that this embodiment has the driving element comprised of a single PMOS transistor 13, therefore it has relatively fast response characteristics, compared with the circuitry of FIGS. 2 and 4. From the foregoing, it is appreciated that since the embodiment is designed such that the current cannot flow from the power supply voltage terminal VCC into the back-bias terminal VBB and further the gate of the PMOS transistor II is provided with the constant voltage Vcc/2, it is possible to prevent the abrupt variation of the pass current Ix due to the power supply voltage variation. In the meantime, it is well known in the art that the cell plate voltage Vp is a voltage which is generated from the cell plate voltage generator (not shown) and is approximately of Vcc/2.

Figure 6:
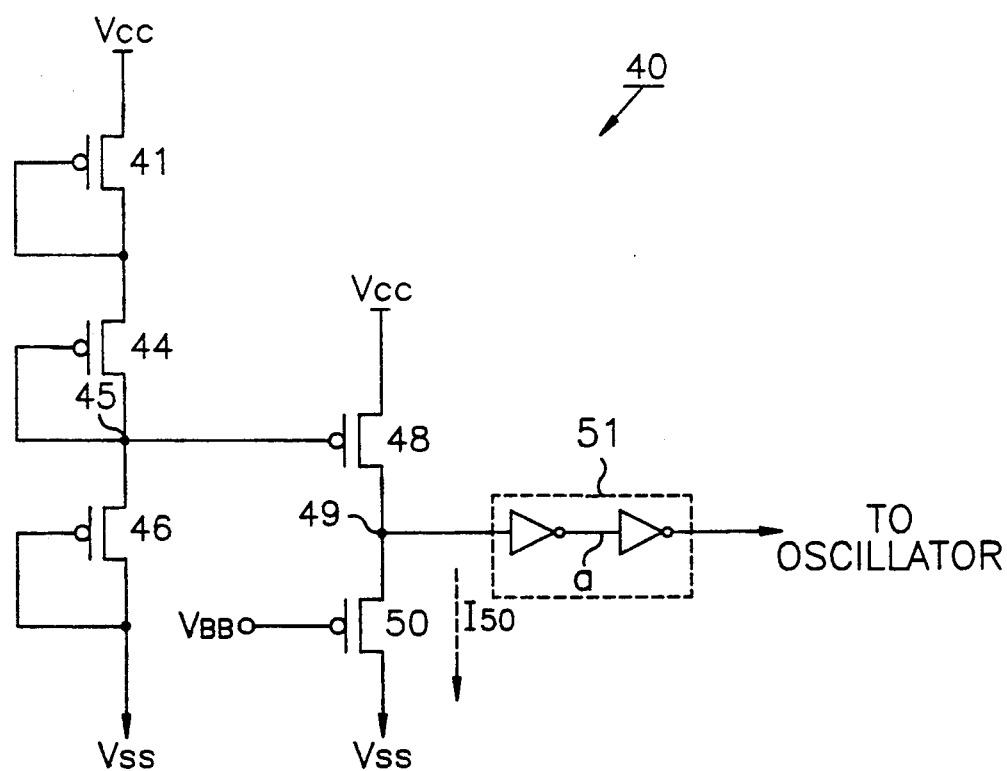
FIG. 6 is another embodiment of the back-bias level sensor according to the present invention.

With reference to FIG. 6, another embodiment of the back-bias level sensor in accordance with the present invention has a plurality of PMOS transistors 41, 44, 46 each having the gates connected to an end of the respective channels, the PMOS transistors being connected in series to each other between the power supply voltage Vcc and the ground voltage Vss. A bias node 45 is formed at the connection of the PMOS transistors 44 and 46. The PMOS transistors 41, 44, 46 together with the bias node 45 form a bias circuit, and the voltage at the bias node 45 will be ⅓Vcc provided that all the PMOS transistors are of the same size. The bias node 45 is coupled to the gate of a PMOS transistor 48 with the channel connected between the power supply voltage Vcc and a sensing node 49. The gate of the PMOS transistor 48 is provided with the constant voltage from the bias node 45, so that the PMOS transistor 48 serves as a load element through which current flows into the sensing node 49, varying according to the voltage at sensing mode 49. A PMOS transistor 50 with the gate provided with the back-bias voltage VBB, is coupled between the sensing node 49 and the ground voltage Vss. In a similar way to the embodiment of FIGS. 4 and 5, the voltage level of the sensing node 49 is dependent on the operation of the PMOS transistor 50.

Now referring to FIGS. 4 through 6, it should be noted that the transistors 34, 13 and 50, the gates thereof being coupled to the back-bias voltage VBB, are all PMOS transistors; however, other types of semiconductor devices of which channel currents can be controlled by insulated gates, can be employed for the same end.

Figure 1:
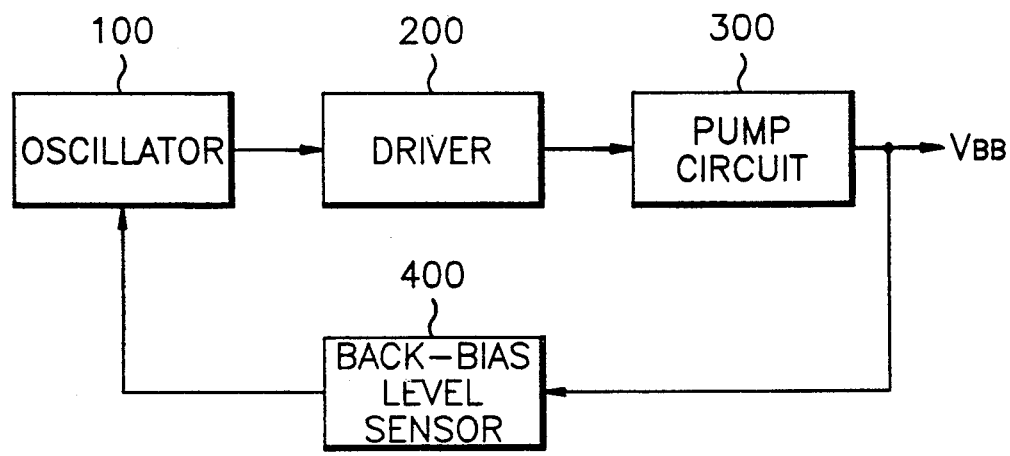
FIG. 1 is a block diagram for showing an elemental form of a back-bias generator.
Figure 7:
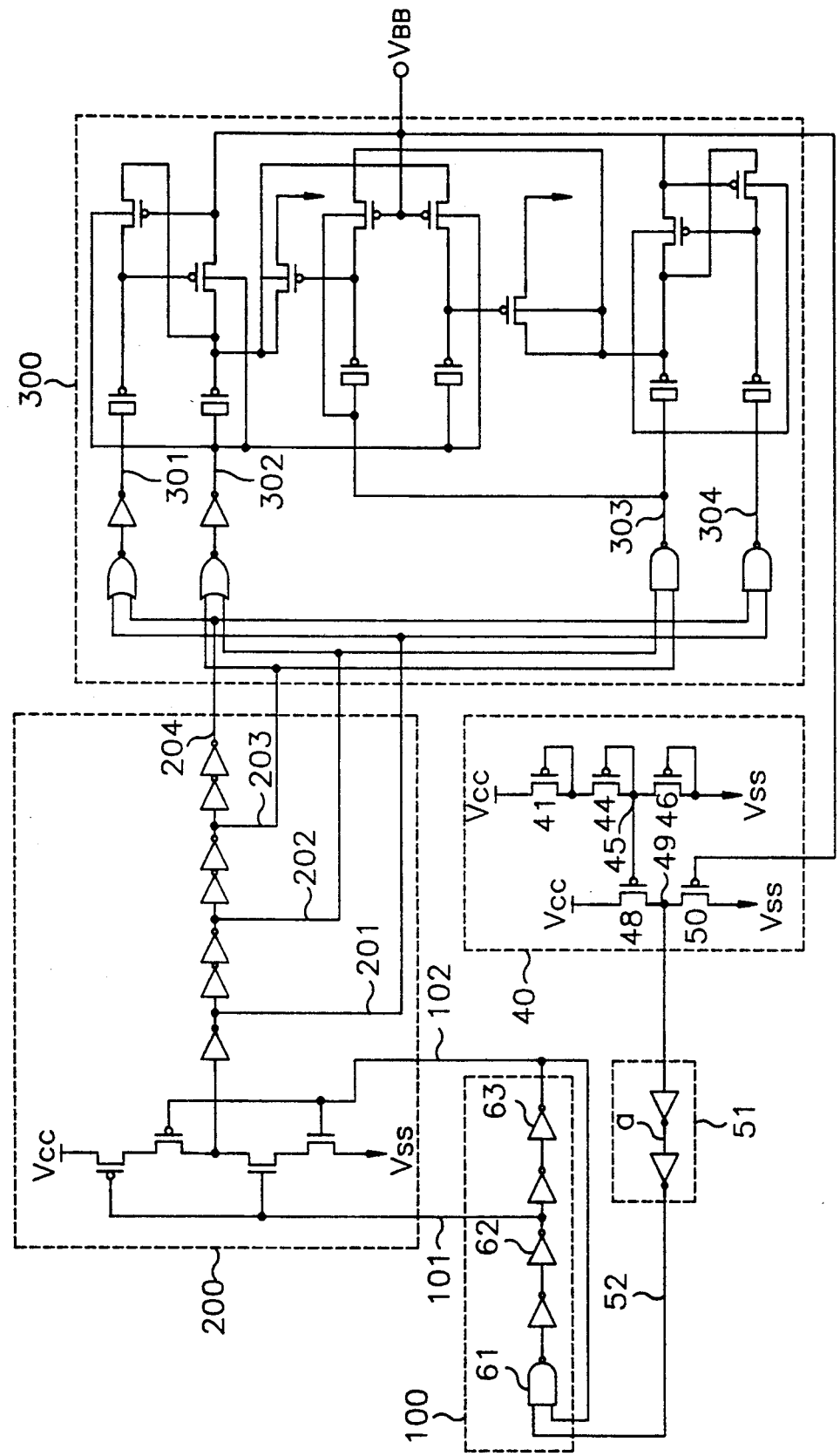
FIG. 7 is a view of employing the inventive back-bias level sensor for the back-bias generator of FIG. 1.

Referring to FIG. 7, the inventive back-bias level sensor 40 of FIG. 6 is employed for the back-bias generator of FIG. 1. As shown in the drawing, the back-bias voltage VBB is commonly coupled to the output of the pump circuit 300 and the gate of the PMOS transistor 50 in the back-bias level sensor 40. The sensing node 49 of the back-bias level sensor 40 is coupled to an input terminal of input NAND gate 61 in the oscillator 100, by way of the delay circuit 51. It can be readily understood that the oscillator 100 is enabled/disabled in response to the logic value at the input terminal of the NAND gate 61 to which the sensing node 49 is connected. The oscillator 100 is a well known circuit, wherein the outputs 101 and 102 of the inverters 62 and 63 are respectively applied to the pump circuit 300 via the driver 200. The pump circuit 300 is comprised of PMOS capacitors and PMOS transistors, so it is appreciated that the back-bias voltage VBB is pumped up when the pumping clocks from the pumping signal lines 301–304 are at the logic low, so as to increase the absolute value of the back-bias voltage VBB. It should be noted that in FIG. 7, the oscillator 100, driver 200 and pump circuit 300, with the exception of the back-bias level sensor 40, are all well known conventional circuits.

With reference to FIGS. 8A to 8F, operations of the back-bias level sensor and the back-bias generator in accordance with the present invention are illustrated hereinafter. There are respectively illustrated the back-bias voltage VBB (FIG. 8A), the sensing current 150 (FIG. 8B) passing from the back-bias level sensor to the ground voltage Vss via the PMOS transistor 50, the voltage V49 (FIG. 8C) at the sensing node 49 varying according to the sensing current I50, the voltage output V52 (FIG. 8D) of the delay circuit 51, the voltage outputs V101 and V102, (FIG. 8E) at the lines 101 and 102 of the oscillator 100, and the voltage characteristic curves (FIG. 8F) for V49 and Va.

Figure 3A:
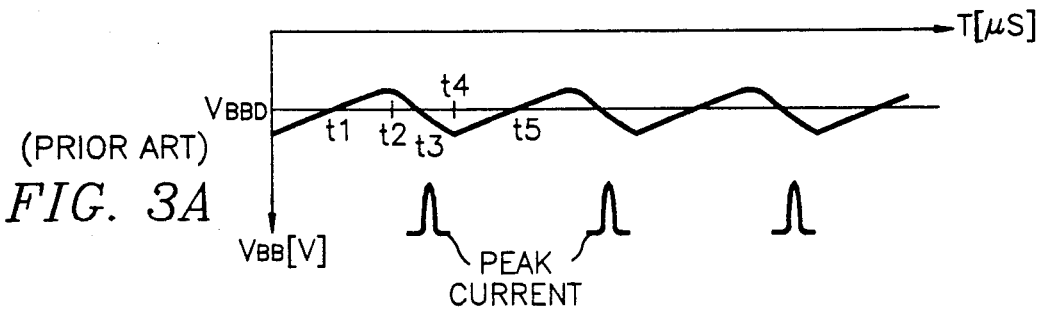
FIGS. 3A to 3F are operational waveforms of the conventional back-bias level sensor of FIG. 2.
Figure 3B:
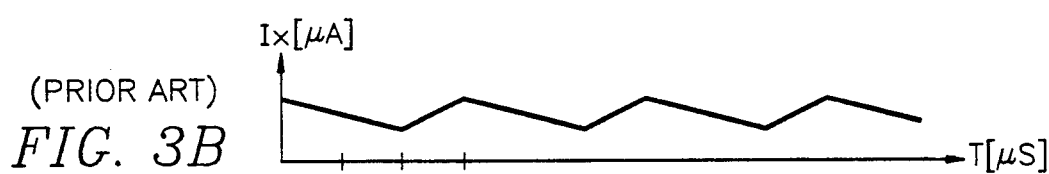
Figure 3C:
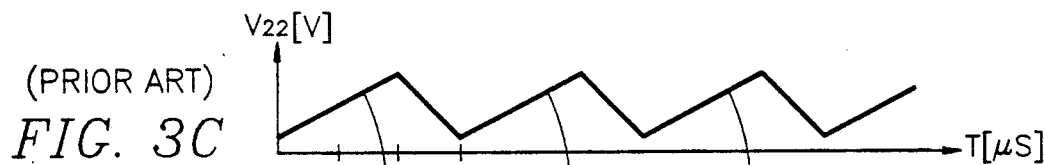
Figure 3D:
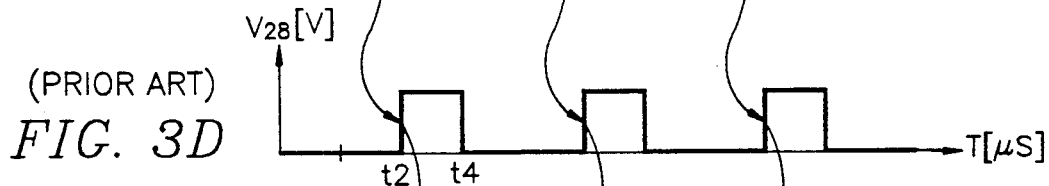
Figure 3E:
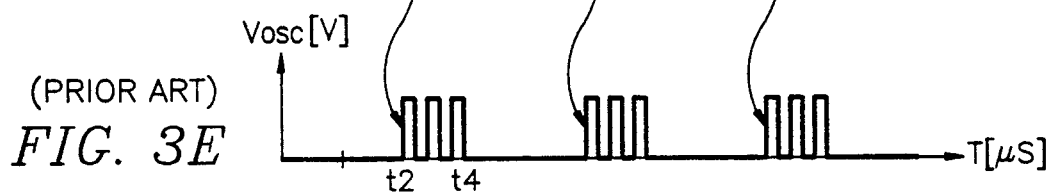
Figure 3F:
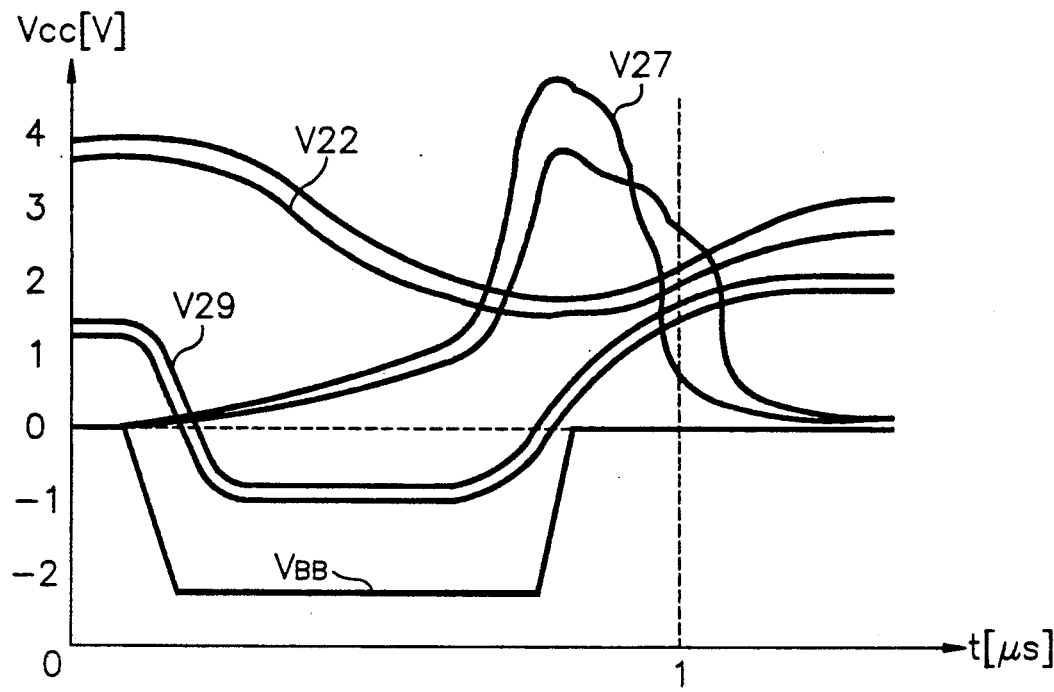
Figure 8F:
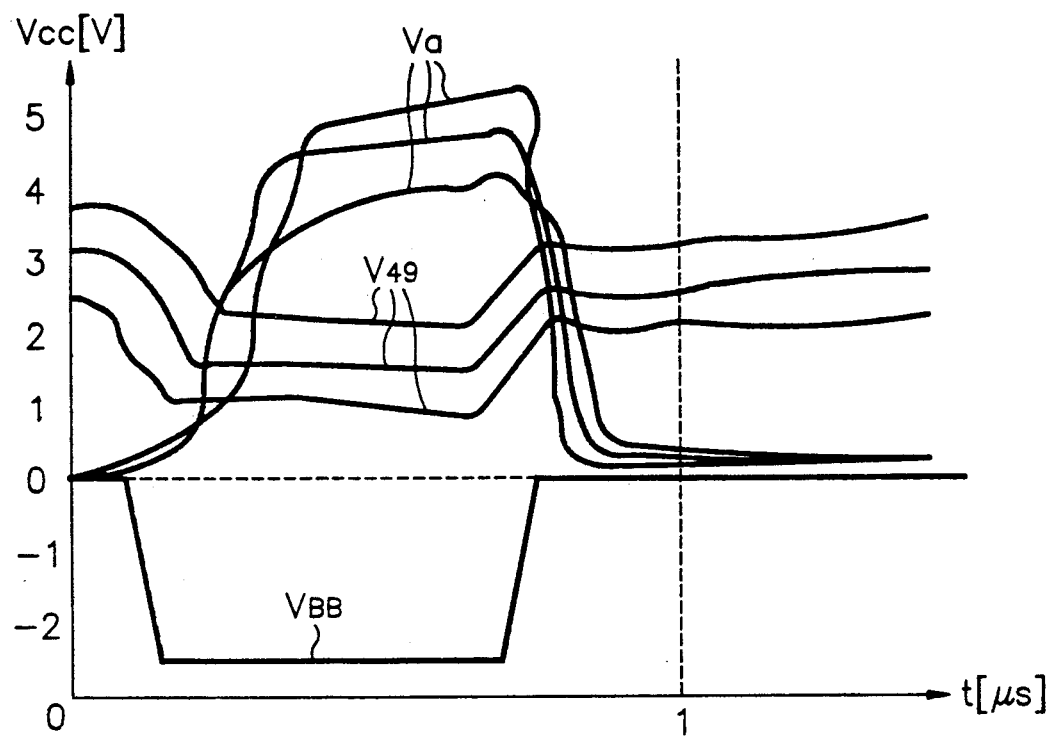

Referring in particular to FIG. 8F, the curves Va and V49 represent the voltage characteristics at the node "a" of the delay circuit 51 and the output node 49, respectively. When considering this in comparison with FIG. 3F, it is noted that the response characteristics are definitely improved and this is a result of simplifying the driving stage of the back-bias level sensor.

Now, referring back to FIGS. 7 and 8A–8F, operation of the back-bias level sensor according to the present invention will be described hereinafter by way of an example.

First, it should be noted that hereinbelow, for convenience, by way of an example only, the back-bias level sensor 40 of FIG. 6 employed for the back-bias generator of FIG. 1 is considered; however, in the case where the back-bias level sensor 30 of FIGS. 4 and 5 is employed, the operation thereof can be considered in the same way.

In FIG. 8A, up to time T11, the back-bias voltage VBB (hereinafter, referred to as the absolute value thereof) has a voltage level higher than a voltage level VBBD at which the oscillator 100 is enabled, so that the back-bias generator is de-energized. In the meantime, if the back-bias voltage VBB provided to the gate of the PMOS transistor 50 is reduced, then the PMOS transistor 50 becomes gradually non-conductive. Finally, with the passage of time T11 if the back-bias voltage VBB becomes lower than the voltage VBBD passing the time T11, then the sensing current I50 will decrease.

From the time T11 forward, the voltage V49 at the sensing node 49 will increase by degrees (see FIG. 8C), as the sensing current I50 decreases. The increased voltage V49 at the sensing node 49 is applied to the delay circuit 51 and then the delay circuit 51 provides the oscillator 100 with the logic high voltage V52 (see FIG. 8D), in a little while, i.e., at the time TI2. Namely, this situation can be considered that since the current back-bias voltage VBB is in the state of the degradation, it must be pumped up to a desirable normal voltage level.

Regarding the oscillator 100, it will be enabled in response to the logic high voltage V52 applied to an input terminal of the NAND gate 61. While the oscillator 100 is enabled (i.e., the voltage V52 is at the logic high value), the ring signals as shown in FIG. 8E will be produced at the inverters 62 and 63. Furthermore, for the same time interval (i.e., from the time T12 to the time TI3, the pump circuit 300 operates to move the back-bias voltage u to the desirable normal level.

In the time during which the back-bias voltage is moving to the normal level, as the back-bias voltage VBB becomes higher than the voltage VBBD, the sensing current I50 immediately increases again and simultaneously the sensing voltage V49 is lowered; therefore, the oscillator 100 recognizes that the pumping operation is no longer necessary and is disabled at the time T13. Of course, at this moment, since the output of the driver 200 as well as the output of the oscillator 100 are all at the logic high, the pump circuit 300 cannot operate to perform the pumping operation.

Accordingly, provided that after the time T13 the sensing current I50 does not flow into the ground terminal due to the degradation of the back-bias voltage caused by the hole current of the substrate, the back-bias voltage will sustain the current level. As can be appreciated from the foregoing, the back-bias voltage according to the present invention may suffer from the degradation due to only the substrate characteristics itself, i.e., the hole current; therefore, it can be possible that if the back-bias voltage is reduced for whatever reasons, the oscillator operates to increase the back-bias voltage to the desirable normal level. However, as regards the conventional back-bias level sensor, the back-bias voltage is degraded directly due to the sensing current for sensing the back-bias level. Therefore, it is apparent from the foregoing description that the relationships between the sensing current and the back-bias voltage in the present invention are greatly different from those in the prior art.

In the above embodiment, a PMOS transistor is used for the sensing transistor which is controlled by the back-bias voltage. However, it is understood by a person skilled in the art that other types of insulation-gate MOS transistors or semiconductor devices, which have a specific operation trip level can be used. Moreover, although the invention was explained for the negative back-bias voltage, a positive back-bias voltage can be used. In this case, the PMOS transistors 13, 34 and 50 shown in FIGS. 4-7 should be substituted with the insulation-gate MOS transistor with a positive threshold voltage and the pump circuit 300 in FIG. 7 should be comprised of NMOS transistors and NMOS capacitors.

Furthermore, although the above embodiments apply the back-bias voltage directly to the gate of the PMOS transistor 50, one skilled in the art will easily recognize that modifications in detail may be made without departing from the spirit and scope of the invention. In addition, the power supply voltage can be of either the external power supply voltage, or the internal power supply voltage converted to be lower than the external power supply voltage. This is dependent on the operation voltage used for the semiconductor device having the above back-bias level sensing circuit.

As can be appreciated from the foregoing, the back-bias generator according to the present invention controls the sensing current in response to the back-bias voltage level and has the sensing current path not directly connected to the back-bias voltage terminal, thereby reducing the degradation of the back-bias voltage due to the sensing current.

Furthermore, the back-bias generator according to the present invention prevents the excessively frequent pumping operation, thereby resulting in current consumption. Finally, the inventive device reduces the number of the peak voltage generation at the back-bias voltage terminal, the peak voltage being induced during the transition of the back-bias voltage from the degraded voltage to the normal voltage, so that noise components due to the peak voltage can be restricted. In addition, the inventive back-bias level sensor is so simple in structure that the response characteristics are definitely improved.

What is claimed is:

1. A circuit for sensing a level of a back-bias voltage in a back-bias generator including a pump circuit, said circuit comprising:
   driving means for driving said pump circuit;
   a control terminal coupled to said back-bias voltage;
   a sensing terminal coupled to said pump circuit by way of aid driving means; and
   an electrical channel for electrically connecting said sensing terminal to a ground reference voltage terminal in response to said level of said back-bias voltage, said channel being electrically insulated from said control terminal by an insulating element.

2. The circuit according to claim 1, wherein said sensing terminal is coupled to an end of said channel of an insulation-gate metal oxide semiconductor transistor controllable in response to said back-bias voltage.

3. The circuit according to claim 1, wherein said driving means for driving said pump circuit comprises:
   oscillating means responsive to a voltage level at said sensing terminal; and
   a driver coupled to said oscillating means, for transferring an output of said oscillating means to said pump circuit.

4. The circuit according to claim 1, wherein said electrical channel is conductive when said control terminal is at a first voltage level and said channel is non-conductive when said control terminal is at a second voltage level.

5. The circuit according to claim 4, wherein said driving means operates only when said terminal is at said second voltage.

6. A circuit for sensing a level of a back-bias voltage in a back-bias generator including a pump circuit for providing a first conductive-type substrate with said back-bias voltage in a given level and oscillating means for providing said pump circuit with pumping clocks, comprising:

a first metal oxide semiconductor transistor with a gate connected to an output of said pump circuit, and a channel having a first end connected to a ground reference voltage terminal and a second end of said channel connected to an input of said oscillating means; and a second metal oxide semiconductor transistor with a gate connected to receive a constant bias voltage, and a channel having a first end connected to said channel of said first metal oxide semiconductor transistor at a first connection node, and another end of said channel of said second metal oxide semiconductor transistor connected 7. The circuit according to claim 6, wherein said second metal oxide semiconductor transistor has a threshold voltage lower than said constant bias voltage.

8. A circuit according to claim 6, wherein said power supply voltage is one of an externally supplied power voltage and an internally supplied power voltage converted from said externally power voltage to be lower than said externally supplied power voltage.

9. The circuit according to claim 6, wherein said oscillating means is energized only when a voltage at said first connection node of said first and second metal oxide semiconductor transistors is discharged through said channel of said first metal oxide semiconductor transistor.

10. The circuit according to claim 6, further comprised of a delay circuit connected between said first connection node and said input of said oscillating means.

11. The circuit according to claim 6, further comprised of a bias voltage generator, comprising:

a third metal oxide semiconductor transistor having a gate and a first end of a channel being coupled in common to each other and a second end of said channel of said third metal oxide semiconductor transistor being coupled to said power supply voltage;

a fourth metal oxide semiconductor transistor having a gate and a first end of a channel being coupled in common to each other and a second end of said channel of said fourth metal oxide semiconductor transistor being coupled to said first end of said channel of said third metal oxide semiconductor transistor;

a fifth metal oxide semiconductor transistor having a gate and a first end of a channel being coupled in common to each other and a second end of said channel of said fifth metal oxide semiconductor transistor being coupled to said first end of said channel of said fourth metal oxide semiconductor transistor at a second connection mode; and a bias voltage generating terminal formed at said second connection mode of said fourth and fifth metal oxide semiconductor transistors, for generating said bias voltage to be provided to said gate of said second metal oxide semiconductor transistor.

12. The circuit according to claim 11, wherein said bias voltage is approximately Vcc/3, where VCC is said power supply voltage.

13. The circuit according to claim 6, wherein said bias voltage is provided from a cell plate voltage generator.

14. The circuit according to claim 13, wherein said bias voltage is Vcc/2, where Vcc is said power supply voltage.

15. A circuit for sensing a voltage level of a back-bias voltage in a back-bias generator including a pump circuit for providing said back-bias voltage to a semiconductor substrate, and oscillating means for providing said pump circuit with pumping clocks, said circuit comprising:

a node for sensing said voltage level of said back-bias voltage;

first static resistor means coupled between said node and a power supply voltage terminal for providing a constant resistance;

second static resistor means, having a first end coupled to said node for providing a constant resistance; and dynamic resistor means coupled between a second end of said second static resistor, and a ground reference voltage terminal, said dynamic resistor means having a control terminal coupled to an output of said pump circuit, for providing a variable resistance in response to said voltage level of said back-bias voltage.

16. The circuit according to claim 15, wherein said voltage level at said node is responsive to said first static resistor means when said control terminal is at a first state, wherein said voltage level at said node is responsive to said second static resistor means and said dynamic resistor means when said control terminal is at a second state.

17. The circuit according to claim 16, wherein said dynamic resistor means is conductive only during said second state.

18. The circuit according to claim 16, wherein said oscillating means is energized only during said first state.

19. The circuit according to claim 15, wherein said first static resistor means is a metal oxide semiconductor transistor having a gate coupled to said ground reference voltage terminal.

20. A circuit according to claim 15, wherein said second static resistor means is a metal oxide semiconductor transistor having a gate coupled to said power supply voltage.

21. A circuit in a back-bias generator comprising an oscillator, a driver and a pump circuit, wherein said circuit senses a back-bias voltage level in a semiconductor device and controls said oscillator, said circuit comprising:

a first metal oxide semiconductor transistor having a gate coupled to said pump circuit to receive said back-bias voltage level and a channel having a first end connected to a first reference potential; and a second metal oxide semiconductor transistor having a gate connected to a second reference potential and a channel having a first end connected to said second end of said channel of said first metal oxide semiconductor transistor at a connecting node and a second end connected to a third reference potential;

said connecting mode being coupled to said oscillator.

22. The circuit as claimed in claim 21, wherein said second reference potential is a cell plate voltage from a cell plate voltage generator.

23. The circuit as claimed in claim 21, further comprising:

a third metal oxide semiconductor transistor having a gate and a channel having a first end commonly connected to said first reference potential and a second end connected to said gate of said second metal oxide semiconductor transistor;

a fourth metal oxide semiconductor transistor having a gate and a channel having a first end commonly connected to said gate of said second metal oxide semiconductor transistor;

a fifth metal oxide semiconductor transistor having a gate and a channel having a first end commonly connected to a second end of said channel of said fourth metal oxide semiconductor transistor and a second end connected to said third reference potential.

24. The circuit as claimed in claim 21, wherein said third reference potential is one of an external power supply voltage and an internal power supply voltage converted to said third 25. The circuit as claimed in claim 21, further comprising a delay circuit connected between said connecting node and said oscillator.

26. A circuit in a back-bias generator comprising an oscillator, a driver and a pump circuit, wherein said circuit senses a back-bias voltage level in a semiconductor device and controls said oscillator, said circuit comprising:

a first metal oxide semiconductor transistor having a gate coupled to said pump circuit to receive said back-bias voltage level and a channel having a first end connected to a first reference potential; and a second metal oxide semiconductor transistor having a gate connected to a second reference potential and a channel having a first end connected to said second end of said channel of said first metal oxide semiconductor transistor at a first connecting node;

a third metal oxide semiconductor transistor having a gate connected to a third reference potential and a channel having a first end connected to a second end of said channel of said second metal oxide semiconductor at a second connecting node and a second end connected to said second reference potential;

said second connecting node being coupled to said oscillator.

27. A circuit for generating and controlling a back-bias voltage level in a semiconductor device, said circuit comprising:

pump means for generating said back-bias voltage level in response to a pumping clock;

driving means for generating said pumping clock in response to a control signal;

a first metal oxide semiconductor transistor having a gate coupled to said pump circuit to receive said back-bias voltage level and a channel having a first end connected to a first reference potential; and a second metal oxide semiconductor transistor having a gate connected to a second reference potential and a channel having a first end connected to said second end of said channel of said first metal oxide semiconductor transistor at a connecting node and a second end connected to a third reference potential;

said connecting node transmitting said control signal to said oscillator.

28. The circuit as claimed in claim 27, further comprising:

a third metal oxide semiconductor transistor having a gate and a channel having a first end commonly connected to said first reference potential and a second end connected to said gate of said second metal oxide semiconductor transistor;

a fourth metal oxide semiconductor transistor having a gate and a channel having a first end commonly connected to said gate of said second metal oxide semiconductor transistor;

a fifth metal oxide semiconductor transistor having a gate and a channel having a first end commonly connected to a second end of said channel of said fourth metal oxide semiconductor transistor and a second end connected to said third reference potential.

* * * * *

UNITED STATES PATENT AND TRADEMARK OFFICE
CERTIFICATE OF CORRECTION

PATENT NO. : 5,262,989
DATED : 16 November 1993
INVENTOR(S) : Young-Taek Lee, et al.

It is certified that error appears in the above-indentified patent and that said Letters Patent is hereby corrected as shown below:

Column 5,

Lines 34-35,    replace "transistor II" with --transistor 11--;

Column 6,

Line 35,    change "150" to --I50--;

Column 8,

Line 38,    change "aid" to --said--;

Column 9,

Line 13,    after "connected", insert --to a power supply voltage--; and

UNITED STATES PATENT AND TRADEMARK OFFICE
CERTIFICATE OF CORRECTION

PATENT NO. : 5,262,989
DATED : 16 November 1993
INVENTOR(S) : Young-Taek Lee, et al.

It is certified that error appears in the above-indentified patent and that said Letters Patent is hereby corrected as shown below:

Column 11,

Line 15,     after "third", insert --reference potential--.

Signed and Sealed this

Thirtieth Day of August, 1994

*Attest:*

BRUCE LEHMAN

*Attesting Officer*      *Commissioner of Patents and Trademarks*